(12) United States Patent
Lazaro

(10) Patent No.: US 11,515,839 B2
(45) Date of Patent: Nov. 29, 2022

(54) ISOLATED POWER TRANSFER VIA COUPLED OSCILLATORS

(71) Applicant: TEXAS INSTRUMENTS INCORPORATED, Dallas, TX (US)

(72) Inventor: Orlando Lazaro, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/087,356

(22) Filed: Nov. 2, 2020

(65) Prior Publication Data

US 2022/0140786 A1 May 5, 2022

(51) Int. Cl.
*H03B 5/12* (2006.01)
*H02J 50/10* (2016.01)

(52) U.S. Cl.
CPC ............ *H03B 5/1212* (2013.01); *H02J 50/10* (2016.02); *H03B 5/1228* (2013.01)

(58) Field of Classification Search
CPC .............................. H03B 5/1212; H02J 50/10
USPC ..................................... 331/117 FE; 307/104
See application file for complete search history.

(56) References Cited

U.S. PATENT DOCUMENTS

| 10,547,200 | B2 * | 1/2020 | Abidi | H02J 7/045 |
| 2013/0063219 | A1 * | 3/2013 | Shanan | H03B 5/1228 |
| | | | | 331/117 FE |
| 2016/0056762 | A1 * | 2/2016 | Ximenes | H03M 1/002 |
| | | | | 331/117 FE |
| 2016/0105034 | A1 * | 4/2016 | Lee | H02J 50/12 |
| | | | | 307/104 |
| 2016/0380483 | A1 * | 12/2016 | Rehm | H04B 5/0037 |
| | | | | 307/104 |
| 2017/0070354 | A1 * | 3/2017 | Ragonese | H04B 3/54 |

\* cited by examiner

*Primary Examiner* — Joseph Chang
(74) *Attorney, Agent, or Firm* — Charles A. Brill; Frank D. Cimino

(57) ABSTRACT

A system includes a power receiver including an oscillator with a first coil and a second coil. The oscillator includes a first field effect transistor (FET) having first gate, first source, and first drain terminals, the first drain terminal coupled to the first coil, the first coil adapted to be inductively coupled to a third coil in a power transmitter. The oscillator also includes a first capacitor coupled to the first coil. The oscillator includes a second FET having second gate, second source, and second drain terminals, the second gate terminal coupled to the first capacitor, the second source terminal coupled to the first source terminal, and the second drain terminal coupled to the second coil, the second coil adapted to be inductively coupled to a fourth coil in the power transmitter. The oscillator includes a second capacitor coupled to the first gate terminal and coupled to the second coil.

27 Claims, 4 Drawing Sheets

ISOLATED POWER TRANSFER VIA COUPLED OSCILLATORS

BACKGROUND

Electronic isolation is a means of preventing the transfer of direct current (DC) and unwanted alternating current (AC) between two parts of a system while still enabling signal and power transfer between those two parts. One method for electrical isolation is to use a transformer to transmit energy from a transmitter to a receiver. Electrical energy can be transferred between separate coils of the transformer without a conductive connection between the transmitter and the receiver.

SUMMARY

In at least one example, a system includes a power receiver including an oscillator, wherein the oscillator includes a first coil and a second coil. The oscillator also includes a first field effect transistor (FET) having a first gate terminal, a first source terminal, and a first drain terminal, the first drain terminal coupled to the first coil, the first coil adapted to be inductively coupled to a third coil in a power transmitter. The oscillator includes a first capacitor coupled to the first coil. The oscillator also includes a second FET having a second gate terminal, a second source terminal, and a second drain terminal, the second gate terminal coupled to the first capacitor, the second source terminal coupled to the first source terminal, and the second drain terminal coupled to the second coil, the second coil adapted to be inductively coupled to a fourth coil in the power transmitter. The oscillator also includes a second capacitor coupled to the first gate terminal and coupled to the second coil.

In at least one example, a system includes a power transmitter including an oscillator. The oscillator include a first FET having a first gate terminal, a first source terminal, and a first drain terminal, the first drain terminal coupled to a first coil. The oscillator also includes a first capacitor coupled to the first coil. The oscillator also includes a second FET having a second gate terminal, a second source terminal, and a second drain terminal, the second gate terminal coupled to the first capacitor, the second source terminal coupled to the first source terminal, and the second drain terminal coupled to a second coil. The oscillator also includes a second capacitor coupled to the first gate terminal and adapted to be coupled to the second coil.

In at least one example, a method includes providing an input voltage to a first oscillator in a power transmitter, the first oscillator including a first coil and a second coil. The method also includes driving a current through the first and second coils to create a first magnetic field and a second magnetic field. The method also includes inducing a first electromotive force in a second oscillator of a power receiver via the first magnetic field, the second oscillator including third and fourth coils. The method also includes inducing a second electromotive force in the second oscillator via the second magnetic field. The method also includes providing an output voltage to a load via the second oscillator, the output voltage proportional to the input voltage.

DETAILED DESCRIPTION

Figure 1A:
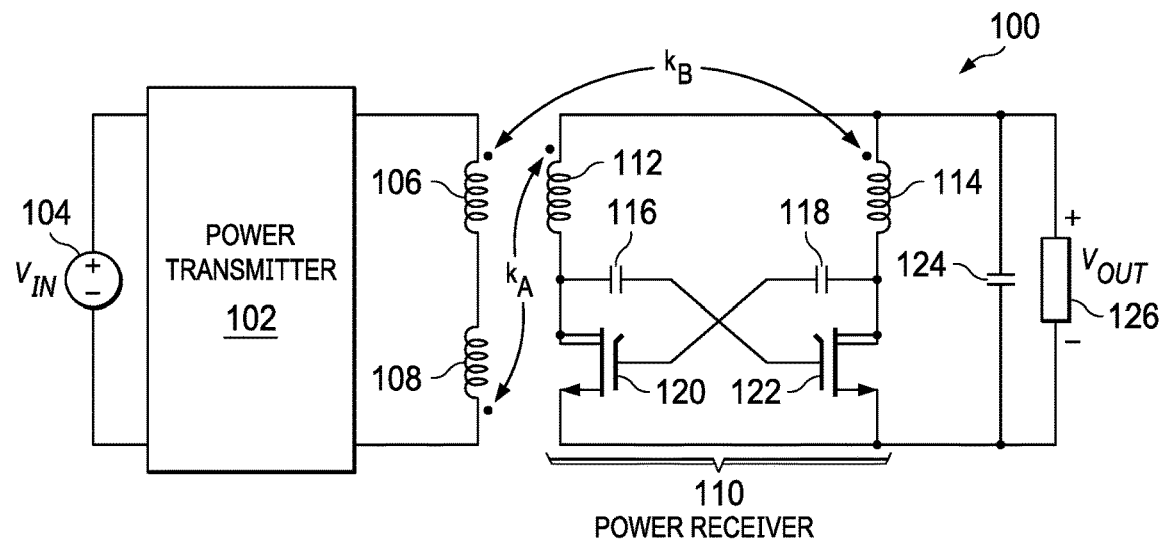
FIG. 1A is a schematic diagram of a power transfer system in accordance with various examples.

One technique for isolated power transfer uses a transmitter and a receiver, with the power transferred via a transformer. An isolation barrier in the transformer blocks transmission of the DC component in a signal from the transmitter to the receiver, but allows the AC components of the signal to cross the barrier. Power is transferred by way of magnetic induction from a coil on the transmitter side to a coil on the receiver side. The voltages and currents in the transmitter coil generate a magnetic flux, and that magnetic flux induces an electromotive force (EMF) in the receiver coil, which creates a current in the receiver coil.

In some conventional systems, a power transmitter uses a half bridge or a full bridge structure to create a square wave voltage that is transmitted across the isolation barrier via magnetic induction. On the receiver side of the conventional system, some form of rectification is performed to convert the incoming AC or AC-like signal from the transmitter to a DC signal. Rectification can either be passive (such as by using a diode bridge rectifier) or active (such as by using active switches). Passive rectification is generally less complex to implement than active rectification. With passive rectification, the receiver does not have to be synchronized with the transmitter. However, diode voltage drops in the diode bridge rectifier cause power losses that reduce the overall efficiency of the system. With active rectification, switches in the receiver are configured to run at a specific frequency to correlate with the frequency of the incoming signal from the transmitter. Some conventional systems use a sense coil at the receiver to sense the magnetic field from the transmitter coil and recover the frequency of the incoming signal, and then use a controller to adjust the phase on the receiver side based on the recovered frequency to regulate the receiver output. The switches in the receiver used for active rectification incur power losses from driving the transistors that make up the switches (e.g., a gate drive loss). These gate drive losses are proportional to the switching frequency. A higher switching frequency means that the transistors turn on and off more times per second, so a higher switching frequency leads to more gate drive losses.

Conventional systems therefore suffer power losses on both the transmitter side and the receiver side. The transformer itself also experiences power losses. Transformer efficiency is a strong function of the quality factor Q of the coils. The quality factor Q is a dimensionless unit representing the fraction of magnetic energy stored in a coil to the energy lost (commonly ohmic) during one period (often defined with a multiplicative factor of $2\pi$). Quality factor Q is the ratio of the inductance L to the resistance R of the coil at a given frequency $\omega$; $Q=(\omega L)/R$. Miniaturized coils (e.g., coils on an electronic chip that use an air core) have reasonable Q at a high switching frequency $\omega$. However, as described above, a higher switching frequency leads to higher gate drive losses from driving the transistors in the receiver at the higher frequency. Therefore, with miniaturized coils, a high switching frequency used to achieve a high Q leads to higher gate drive losses.

Examples described herein include a switching-type receiver that does not use passive diodes and also does not suffer from high gate drive losses. Instead, examples herein include a power oscillator in the receiver that uses switches to energize the inductor(s) and capacitor(s) in an LC circuit. The transistors in the power oscillator are driven by resonance, a phenomenon known as resonant gate drive. Switches in conventional systems are driven by hard charging (or ohmic charging) a gate capacitance of a transistor and then hard discharging (or ohmic discharging) the gate capacitance of the transistor. Resonant gate drive, however, recovers the energy used for charging and discharging the gate capacitance of the transistors by utilizing an LC oscillating circuit. In examples described herein, resonant gate drive enables wireless power transfer systems that have lower power losses than conventional systems. In another example described herein, both the transmitter and the receiver include a power oscillator. Different types of oscillators are used in various examples.

FIG. 1A is a schematic diagram of an example system 100. System 100 is a system for wireless power transfer using a transmitter and a receiver. The transmitter (left) side of system 100 includes a power transmitter 102 coupled to a voltage source $V_{in}$ 104. Power transmitter 102 is represented as a block and includes any appropriate type of power transmitter. Power transmitter 102 may use a half-bridge topology, a full-bridge topology, or any other appropriate topology. Voltage source $V_{in}$ 104 supplies a DC voltage to power transmitter 102. The transmitter side of system 100 also includes a transformer coil. In this example, the transformer coil includes two coils 106 and 108. Coil 106 is substantially identical to coil 108 in an example. The dots associated with each coil 106 and 108 in FIG. 1A represent the direction of winding in the coils 106 and 108, which in turn represents the direction of the mutually induced voltage in the coils 114 and 112 pursuant to the dot convention, respectively.

System 100 also includes a power receiver 110 that includes a cross-coupled oscillator according to an example. Power receiver 110 includes coils 112 and 114, capacitors 116 and 118, field effect transistor (FET) 120, and FET 122. Coil 112 has a first terminal coupled to a first terminal of coil 114. Coil 112 has a second terminal coupled to a first terminal of capacitor 116 and a drain terminal of FET 120. A second terminal of capacitor 116 is coupled to a gate terminal of FET 122. A source terminal of FET 120 is coupled to a source terminal of FET 122. A second terminal of coil 114 is coupled to a first terminal of capacitor 118 and a drain terminal of FET 122. A second terminal of capacitor 118 is coupled to a gate terminal of FET 120. The right side of system 100 further includes a capacitor 124 coupled to power receiver 110. Capacitor 124 is also coupled across a load 126. An output voltage $V_{out}$ is provided across load 126 during operation of power receiver 110.

In power receiver 110, the capacitance values of capacitors 116 and 118 are substantially identical in one example. Also, coils 112 and 114 are substantially identical in an example. In system 100, mutual inductance causes a current flowing in coils 106 and 108 to induce a voltage in coils 112 and 114. Specifically, current flowing in coil 106 induces a voltage in coil 114, while current flowing in coil 108 induces a voltage in coil 112. The amount of inductive coupling that exists between coils 106 and 114 and between coils 108 and 112 is expressed as a fractional number between −1 and 1, where 1 indicates full or maximum inductive coupling, 0 indicates zero inductive coupling, and −1 indicates full inductive coupling with a change in polarity. This number is referred to as the coefficient of coupling, and is denoted as k. If k equals 1, the two coils are perfectly coupled. If k>0.5, the two coils are relatively tightly coupled. If 0<k<0.5, the two coils are relatively loosely coupled. In system 100, the coefficient of coupling between coils 108 and 112 is denoted as $k_A$, and the coefficient of coupling between coils 106 and 114 is denoted as $k_B$. In one example, $k_A$ is approximately equal to $k_B$.

Examples herein use resonant gate drive and zero voltage switching to reduce power losses and/or increase switching frequency. Zero voltage switching is performed with a zero voltage switching topology. System 100 uses a resonant LC network where voltage and current waveforms vary sinusoidally during one or more intervals of the switching period. The resonant LC network can also be referred to as a tank network or an LC tank. The LC network stores energy oscillating at the circuit's resonant frequency. The resonant frequency is determined by the capacitance and inductance values in the LC network. In operation, energy oscillates between the capacitors and the inductors in the LC network. In system 100, the energy from coils 106 and 108 on the transmitter side drives the LC network in the power receiver 110. The energy that oscillates between the capacitors 116, 118 and the coils (inductors) 112, 114 in power receiver 110 drives the gate terminals of FETs 120 and 122 to turn FETs 120 and 122 on and off in order to provide output power to load 126.

Zero voltage switching is a technique used in examples herein to reduce power losses. Resonant gate drive allows for zero voltage switching to be used to turn on a FET while the drain-to-source voltage across the FET is zero or near zero. Zero voltage switching involves transitioning (e.g., turning the FET on) while the drain-to-source voltage is zero, which reduces power losses during the FET transition. Power losses occur if a current through a FET and a voltage across a FET both exist during the FET transition (e.g., the transition is the point in time where the FET turns on or off). Driving either the current through the FET to zero (zero current switching) or the voltage across the FET to zero (zero voltage switching) before the transition occurs can reduce these power losses. Zero voltage switching therefore reduces or eliminates the switching losses caused by stored charge and device output capacitances.

Figure 1B:
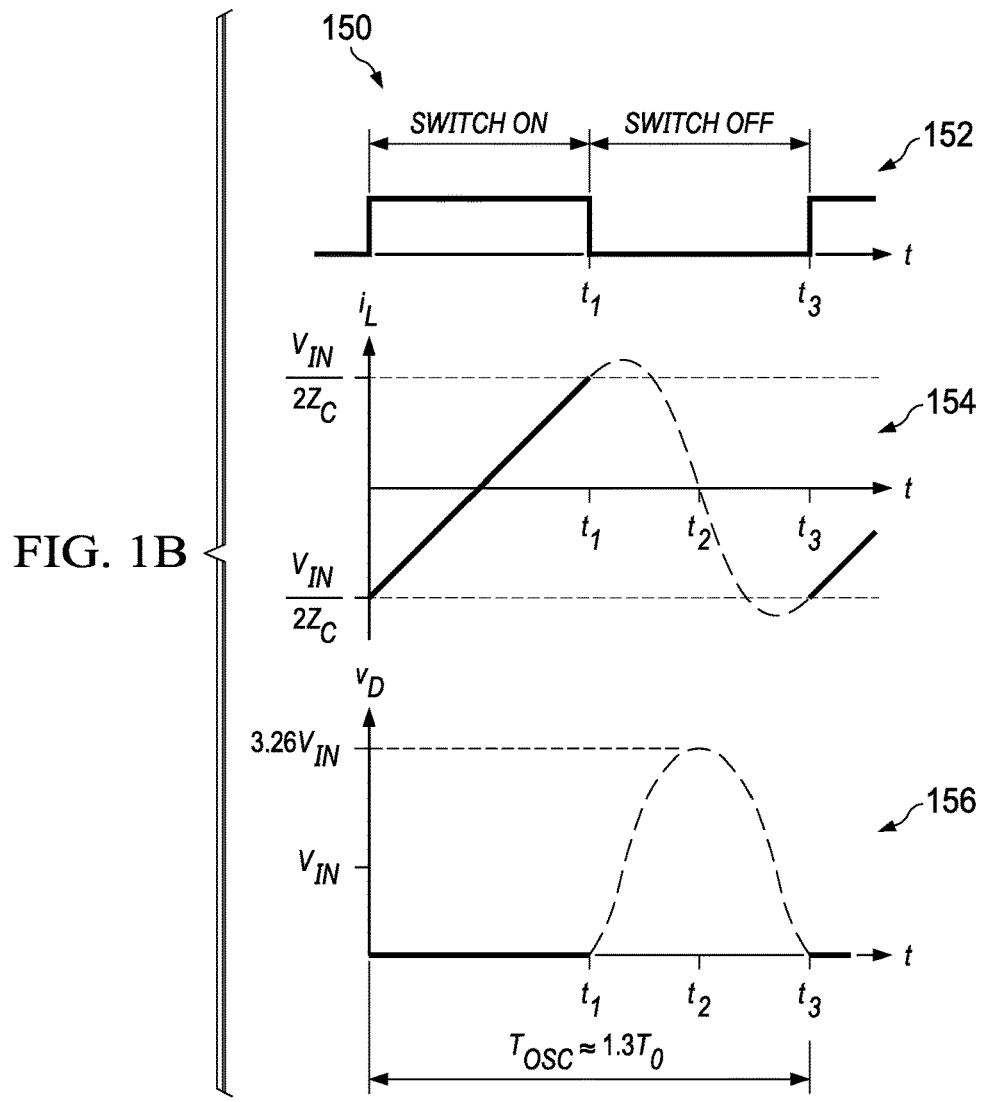
FIG. 1B is a graph of waveforms in an example oscillator system in accordance with various examples.

FIG. 1B is a graph of waveforms 150 of a portion of an oscillator according to one example, such as the oscillator in power receiver 110. FIG. 1B is a simplified model of how oscillation occurs between an inductor and a capacitor. Waveform 152 is an example waveform of an on-time and an off-time of a transistor switch. Waveform 154 is a graph of current $i_L$ through an inductor, where $i_L$ is graphed with respect to time t. Waveform 156 is a graph of a voltage $v_D$ at a drain terminal of a FET, where $v_D$ is graphed with respect to time t.

Responsive to a transistor switch turning on as shown with respect to waveform 152 (such as FET 120 turning on), the voltage at the drain terminal of the FET is connected to ground. On waveform 156, $v_D$=0 volts during the interval of time that the switch of waveform 152 is on. A voltage $V_{in}$ is therefore applied across an inductor (such as coil 112) coupled to the drain terminal of the FET, which increases the current in the inductor. On waveform 154, current $i_L$ ramps up linearly as time t increases while the switch is on. Responsive to the switch turning off at time $t_1$, current still flows through the inductor. This inductor current keeps flowing, and flows into a capacitor coupled to a drain terminal of the FET (such as capacitor 116). The capacitor is charged, and the voltage at the drain terminal increases. This voltage increase is shown in waveform 156, where voltage increases beginning at time $t_1$. At time $t_2$, current in the inductor is dropping and flips polarity as shown in waveform 154 (at the time $v_D$ reaches its peak at time $t_2$, $i_L$ drops below zero, indicating a change in the polarity of $i_L$). These example waveforms therefore are an example of an oscillation between an inductor and a capacitor. Energy flows into the inductor as shown in waveform 154, and then flows out of the inductor and into the capacitor as shown in waveform 156. At time $t_3$, $v_D$ returns to zero. The switch is turned back on at that time. This is an example of zero voltage switching (e.g., turning on a switch at the time that the voltage is at zero). After time $t_3$, the patterns in the waveforms will repeat. FIG. 1B therefore shows, in a simplified manner, how energy oscillates between an inductor and a capacitor in examples herein.

Referring again to FIG. 1A, the transmitter side of system 100 produces a current that flows through coils 106 and 108. This current induces a voltage in coils 112 and 114 via mutual inductance. The induced voltages in coils 112 and 114 initiate the operation of the LC network in power receiver 110. The LC network drives FETs 120 and 122 at the resonant frequency of the receiver, which produces power that is provided to load 126. Therefore system 100 transfers power wirelessly from voltage source $V_{in}$ 104 on the transmitter side to load 126 on the receiver side. Also, due to the use of an oscillator for resonant gate drive in power receiver 110, FETs 120 and 122 experience reduced gate drive losses. With reduced gate drive losses, system 100 can operate at a higher switching frequency than conventional systems. As described above, higher switching frequencies allow miniaturized coils with a higher quality factor Q to be used in certain examples.

If the oscillator in power receiver 110 was allowed to operate at its natural frequency (as determined by the values of L and C), power would not be delivered to load 126 because the frequency of the transmitter side and the frequency of the receiver side would be uncorrelated. However, if an oscillator is stimulated with a signal at a drive frequency that is not exactly the same as the natural frequency of the oscillator but is near the natural frequency, the frequency of the oscillator can be pulled to resonate at the drive frequency. This phenomenon is known as injection locking. As an example, if inductive coupling between two oscillators is strong and the natural frequencies of the two oscillators resonate near one another, a first oscillator can capture a second oscillator and cause the second oscillator to adjust its frequency until the second oscillator has essentially the same frequency as the first oscillator. In FIG. 1A, if inductive coupling between transmitter and receiver coils is strong and the natural frequency of the receiver LC oscillator is near the transmitter drive frequency, the receiver LC oscillator adjusts its frequency via injection locking to the transmitter drive frequency. The use of injection locking allows the transmitter and receiver frequencies to be synchronized even if the two would naturally operate at slightly different frequencies from one another. Injection locking will occur if the frequencies of the receiver oscillator and transmitter driver are within an acceptable margin.

The natural frequency of an oscillator (such as the oscillator in power receiver 110) depends on the values of the inductors and capacitors, the gate capacitances of the FETs, and other factors of the components in the oscillator. If the oscillator has a high Q, it is more difficult to pull the oscillator off of its natural frequency to another frequency via injection locking. In the case of an oscillator with a high Q, the transmitter side can achieve injection locking by operating at a frequency near the natural frequency of the receiver oscillator. The closer the frequency of the transmitter side is to the natural frequency of the receiver side, the more likely the system will achieve injection locking.

Figure 2:
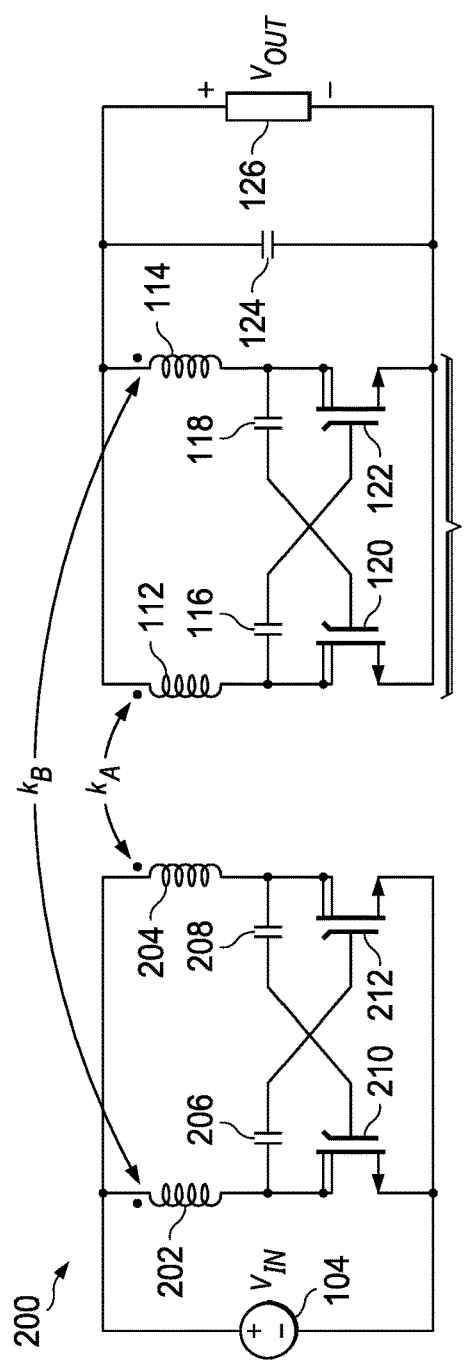
FIG. 2 is a schematic diagram of a power transfer system in accordance with various examples.

FIG. 2 is a schematic diagram of an example system 200. System 200 is a system for isolated power transfer that includes a transmitter side and a receiver side. The receiver (right) side is similar to the receiver side described above with respect to FIG. 1A. In system 200, the transmitter (left) side also includes a cross-coupled oscillator that matches the cross-coupled oscillator in power receiver 110. With this oscillator on the transmitter side, the transmitter achieves efficient high frequency operation in the same manner as power receiver 110 in FIG. 1A, including the use of resonant gate drive and zero voltage switching. In an example, resonant gate drive is used to drive the transistors on the transmitter side, which allows the transistors to operate with zero voltage switching. Therefore the power losses are reduced on the transmitter side just as they are on the receiver side as described above. Also, due to reduced or eliminated gate drive losses, the frequency of system 200 can be increased, leading to a higher quality factor Q in an example system that uses miniaturized coils.

Referring to FIG. 2, the transmitter side of system 200 includes a voltage source $V_{in}$ 104. The cross-coupled oscillator on the transmitter side includes coils 202 and 204, capacitors 206 and 208, and FETs 210 and 212. The structure of the oscillator on the transmitter side is similar to the structure of the oscillator in power receiver 110. In an example, the components of the oscillator in the transmitter are identical or nearly identical to the components of the oscillator in power receiver 110. Voltage source $V_{in}$ 104 is coupled to a first terminal of coil 202 and a first terminal of coil 204. A second terminal of coil 202 is coupled to a first terminal of capacitor 206 and a drain terminal of FET 210. A second terminal of capacitor 206 is coupled to a gate terminal of FET 212. A source terminal of FET 210 is coupled to a source terminal of FET 212. A second terminal of coil 204 is coupled to a first terminal of capacitor 208 and a drain terminal of FET 212. A second terminal of capacitor 208 is coupled to a gate terminal of FET 210. In an example, the values of capacitors 206 and 208 are substantially identical. Also, coils 202 and 204 are substantially identical in an example.

In system 200, a voltage from voltage source $V_{in}$ 104, and the operation of the oscillator components create currents in coils 202 and 204 in an oscillating fashion. Current flowing in coil 202 induces a voltage in coil 114 and current flowing in coil 204 induces a voltage in coil 112. Power is therefore transferred wirelessly across the barrier between the transmitter side and the receiver side. The coefficient of coupling between coils 204 and 112 is $k_A$, and the coefficient of coupling between coils 202 and 114 is $k_B$. In one example, $k_A$ is approximately equal to $k_B$. If the components of the oscillator on the transmitter side are manufactured similarly to the components of the oscillator in power receiver 110, and the transmitter and receiver are manufactured to be physically near one another, the values of $k_A$ and $k_B$ can be quite high (e.g., near 1). Also, if the inductances and capacitances in each oscillator are similar, and the FETs in each oscillator are similar, the switching frequencies of each oscillator will also be near one another. Similar switching frequencies on the transmitter side and the receiver side of system 200 will lead to easier injection locking for synchronizing the operation of the transmitter side and the receiver side.

If the two oscillators are identical or nearly identical in system 200, a voltage $V_{out}$ across load 126 equals $V_{in}-I_{load}R_{out}$. The output voltage $V_{out}$ can be scaled by adjusting the ratio of the number of turns in the coils (112, 114, 202, and 204) of the two oscillators. Also, if the oscillators are identical or nearly identical, the power transfer of system 200 is bidirectional. For example, if voltage source $V_{in}$ 104 were placed on the receiver side while load 126 and capacitor 124 were placed on the transmitter side, system 200 would work "backwards" due to the symmetry in the system, with the right side voltage source and oscillator driving the left side oscillator and load.

Figure 3:
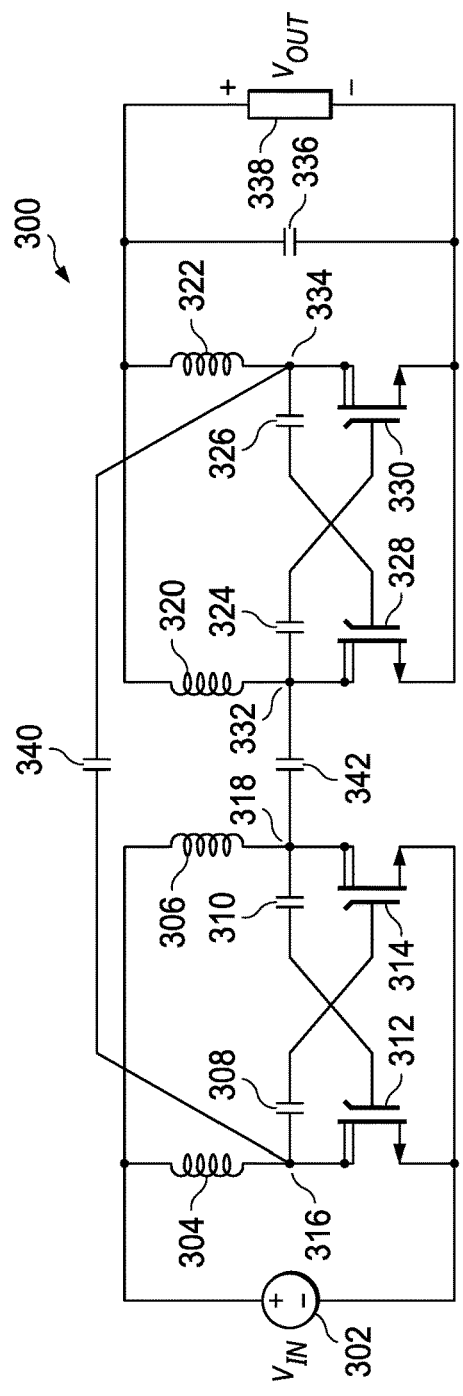
FIG. 3 is a schematic diagram of a power transfer system in accordance with various examples.

FIG. 3 is a schematic diagram of an example system 300. System 300 includes a transmitter side on the left and a receiver side on the right. System 300 transfers power via capacitively coupled oscillators rather than using inductively coupled oscillators as described above in FIGS. 1A and 2. System 300 provides similar benefits to the benefits provided by systems 100 and 200 as described above.

System 300 includes a voltage source $V_{in}$ 302. The cross-coupled oscillator on the transmitter (left) side of system 300 includes coils 304 and 306, capacitors 308 and 310, and FETs 312 and 314. The structure of the oscillator on the transmitter side of system 300 is similar to the structure of the oscillator on the transmitter side in system 200 shown in FIG. 2. System 300, however, uses capacitors 340 and 342 coupled to nodes 316 and 318 to transfer power to the receiver side of system 300. In system 300, voltage source $V_{in}$ 302 is coupled to a first terminal of coil 304 and a first terminal of coil 306. A second terminal of coil 304 is coupled to a first terminal of capacitor 308 and a drain terminal of FET 312. A second terminal of capacitor 308 is coupled to a gate terminal of FET 314. A source terminal of FET 312 is coupled to a source terminal of FET 314. A second terminal of coil 306 is coupled to a first terminal of capacitor 310 and a drain terminal of FET 314. A second terminal of capacitor 310 is coupled to a gate terminal of FET 312. The drain terminal of FET 312 is coupled to node 316, and the drain terminal of FET 314 is coupled to node 318. In an example, the values of capacitors 308 and 310 are substantially identical. Also, coils 304 and 306 are substantially identical in an example.

On the receiver (right) side of system 300, the cross-coupled oscillator includes coils 320 and 322, capacitors 324 and 326, and FETs 328 and 330. The structure of the oscillator on the receiver side of system 300 is similar to the structure of the oscillator on the receiver side in system 100 shown in FIG. 1A. Coil 320 has a first terminal coupled to a first terminal of coil 322 and a second terminal coupled to a first terminal of capacitor 324 and a drain terminal of FET 328. A second terminal of capacitor 324 is coupled to a gate terminal of FET 330. A source terminal of FET 328 is coupled to a source terminal of FET 330. A second terminal of coil 322 is coupled to a first terminal of capacitor 326 and a drain terminal of FET 330. A second terminal of capacitor 326 is coupled to a gate terminal of FET 328. The receiver side of system 300 further includes a capacitor 336 coupled across a load 338. An output voltage $V_{out}$ is provided across load 338 during operation.

The cross-coupled oscillator on the transmitter side provides resonant gate drive and zero voltage switching for FETs 312 and 314. These features reduce the power losses on the transmitter side. Similarly, the cross-coupled oscillator on the receiver side provides resonant gate drive and zero voltage switching for FETs 328 and 330.

In system 300, coils 304 and 306 on the transmitter side do not transfer power to coils 320 and 322 on the receiver side via inductive coupling. Instead, coupling capacitors 340 and 342 transfer power from the transmitter side to the receiver side via capacitive coupling. Coupling capacitor 340 has a first terminal coupled to node 316 on the transmitter side and a second terminal coupled to node 332 on the receiver side. Coupling capacitor 342 has a first terminal coupled to node 318 on the transmitter side and a second terminal coupled to node 334 on the receiver side. The function of the oscillator on the transmitter side causes changes in voltages at nodes 316 and 318. These changes in voltages cause changes in the voltages across coupling capacitors 340 and 342. Power is transferred from the transmitter side to the receiver side via AC signals across coupling capacitors 340 and 342. The operation of the cross-coupled oscillator on the receiver side of system 300 is similar to the operation of power receiver 110 described above in FIG. 1A. The operation of the cross-coupled oscillator on the receiver side transfers power to load 338.

Capacitive coupling between the transmitter side and the receiver side of system 300 cause the oscillators on each side to injection lock, if the frequencies of each of the oscillators are close in value to one another. If the two oscillators are identical or nearly identical in system 300, a voltage $V_{out}$ across load 338 equals $V_{in}-I_{load}R_{out}$. Also, if the oscillators are identical or nearly identical, the power transfer of system 300 is bidirectional, as described above.

The oscillators shown in FIGS. 1A, 2 and 3 above are examples of class E oscillators. Class E oscillators are highly tuned switching class oscillators. As described above, class E oscillators obtain high efficiency by only operating the switching element at points of zero current (on to off switching) or zero voltage (off to on switching) which mitigates power lost in the switch. Transistors in class E oscillators are driven to operate in a saturation region in order to act as a switch with two discrete states, on and off.

Other examples may use other types of oscillators, such as class D or class F oscillators. Class D oscillators use some form of pulse-width modulation in operation. The transistors in class D oscillators function as switches with two discrete states, on and off. Class F oscillators function similarly to class E oscillators. In some example, class F oscillators boost both efficiency and output by using harmonic resonators in the output network to shape the output waveform into a square wave.

Figure 4:
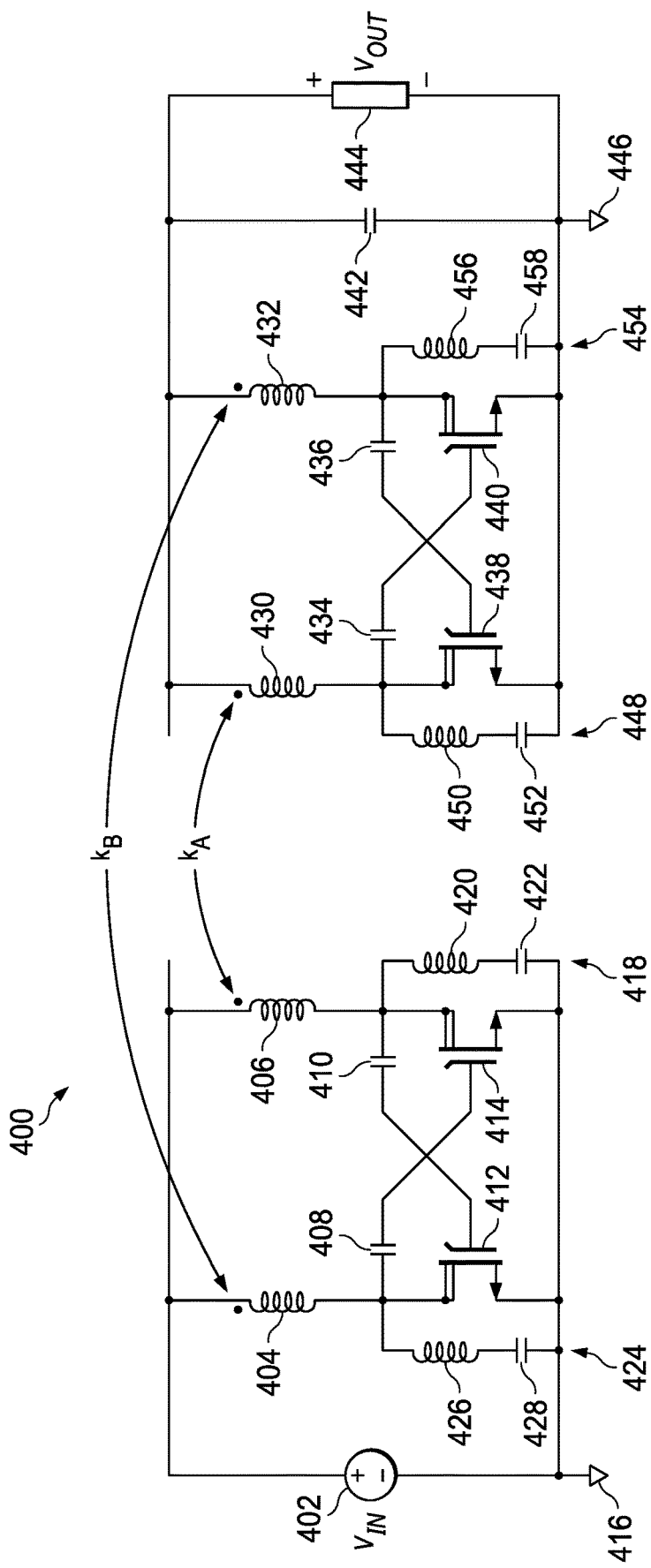
FIG. 4 is a schematic diagram of a power transfer system in accordance with various examples.

FIG. 4 is a schematic diagram of an example system 400. System 400 is a system for isolated power transfer that includes a transmitter side and a receiver side. System 400 is similar to system 200 shown above in FIG. 2, except system 400 uses class F oscillators on the transmitter side and the receiver side rather than class E oscillators. Class F oscillators use harmonic shaping filters as shown in system 400.

System 400 includes a voltage source $V_{in}$ 402. The cross-coupled oscillator on the transmitter (left) side of system 400 includes coils 404 and 406, capacitors 408 and 410, and FETs 412 and 414. System 400 also includes ground 416. The structure of the oscillator on the transmitter side of system 400 is similar to the structure of the oscillator on the transmitter side in system 200 shown in FIG. 2. System 400, however, also includes a harmonic shaping filter 418 that includes an inductor 420 and a capacitor 422. Harmonic shaping filter 418 is coupled to a drain terminal of FET 414. System 400 further includes harmonic shaping filter 424. Harmonic shaping filter 424 includes an inductor 426 and a capacitor 428. In system 400, voltage source $V_{in}$ 402 is coupled to a first terminal of coil 404 and a first terminal of coil 406. A second terminal of coil 404 is coupled to a first terminal of capacitor 408 and a drain terminal of FET 412. A second terminal of capacitor 408 is coupled to a gate terminal of FET 414. A source terminal of FET 412 is coupled to a source terminal of FET 414. A second terminal of coil 406 is coupled to a first terminal of capacitor 410 and a drain terminal of FET 414. A second terminal of capacitor 410 is coupled to a gate terminal of FET 412. Coils 404 and 406 are substantially identical in an example.

On the receiver (right) side of system 400, a cross-coupled oscillator includes coils 430 and 432, capacitors 434 and 436, and FETs 438 and 440. The structure of the oscillator on the receiver side of system 400 is similar to the structure of the oscillator on the receiver side in system 200 shown in FIG. 2. System 400 further includes a capacitor 442 coupled across a load 444. An output voltage $V_{out}$ is provided across load 444 during operation. Capacitor 442 is further coupled to ground 446, which is equivalent to ground 416 in an example. System 400 further includes a harmonic shaping filter 448 that includes an inductor 450 and a capacitor 452. Harmonic shaping filter 448 is coupled to a drain terminal of FET 438. System 400 further includes harmonic shaping filter 454. Harmonic shaping filter 454 includes an inductor 456 and a capacitor 458. In system 400, a first terminal of coil 430 is coupled to a first terminal of coil 432. A second terminal of coil 430 is coupled to a first terminal of capacitor 434 and a drain terminal of FET 438. A second terminal of capacitor 434 is coupled to a gate terminal of FET 440. A source terminal of FET 438 is coupled to a source terminal of FET 440. A second terminal of coil 432 is coupled to a first terminal of capacitor 436 and a drain terminal of FET 440. A second terminal of capacitor 436 is coupled to a gate terminal of FET 438. Coils 430 and 432 are substantially identical in an example.

In system 400, a voltage from voltage source $V_{in}$ 402 creates currents in coils 404 and 406 in an oscillating fashion. Current flowing in coil 406 induces a voltage in coil 430, and current flowing in coil 404 induces a voltage in coil 432. Power is therefore transferred wirelessly across the barrier between the transmitter side and the receiver side. The coefficient of coupling between coils 406 and 430 is $k_A$, and the coefficient of coupling between coils 404 and 432 is $k_B$. In one example, $k_A$ is approximately equal to $k_B$. As with the systems described above, if the inductances and capacitances in each oscillator are similar, and the FETs in each oscillator are similar, the switching frequencies of each oscillator will also be near one another. Similar switching frequencies on each side of system 400 will lead to easier injection locking for synchronizing the operation of the transmitter side and the receiver side.

If the two oscillators are identical or nearly identical in system 400, a voltage $V_{out}$ across load 444 equals $V_{in}-I_{load}R_{out}$. The output voltage $V_{out}$ can be scaled by adjusting the ratio of the number of turns in the coils (404, 406, 430, and 432) of the two oscillators. Also, if the oscillators are identical or nearly identical, the power transfer of system 400 is bidirectional as described above.

Figure 5:
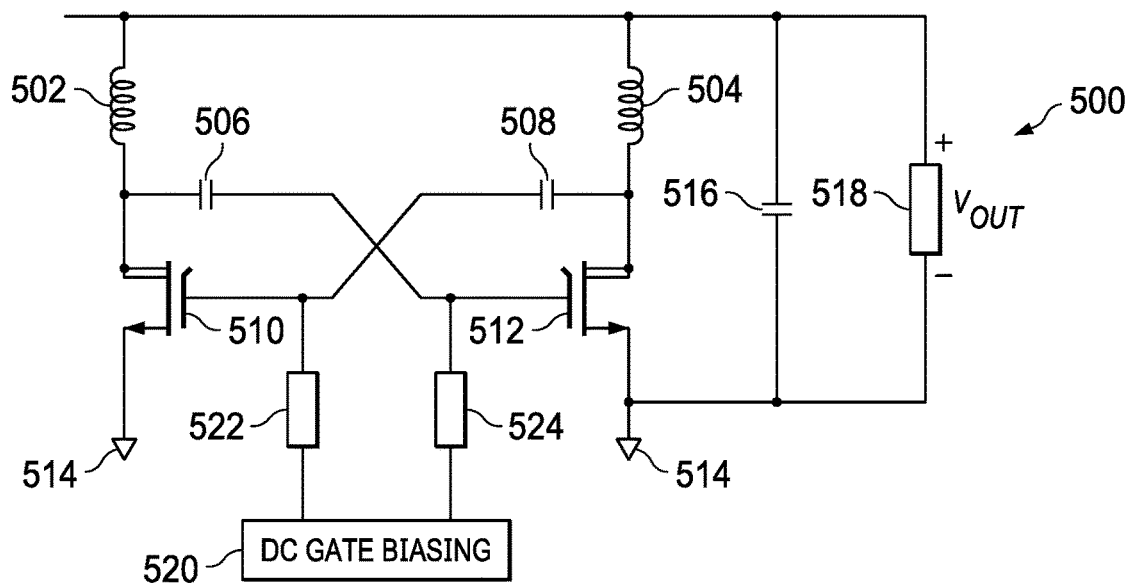
FIG. 5 is a schematic diagram of a power receiver in accordance with various examples.

FIG. 5 is a schematic diagram of an example system 500. System 500 is an example of a power receiver and a load. System 500 includes an oscillator in the receiver that works similarly to the oscillators in the receivers described above. System 500 further includes DC gate biasing circuitry to bias the FETs in the oscillator. Although not shown in FIG. 5, DC gate biasing may also be used for a power transmitter in other examples.

System 500 includes a receiver with a cross-coupled oscillator, where the cross-coupled oscillator includes coils 502 and 504, capacitors 506 and 508, and FETs 510 and 512. FETs 510 and 512 are coupled to ground 514 at their respective source terminals. The structure of the oscillator on the receiver side of system 500 is similar to the structure of the oscillator on the receiver side in system 200 shown in FIG. 2, with the exception of DC gate biasing added to system 500. System 500 further includes a capacitor 516 coupled across a load 518. An output voltage $V_{out}$ is provided across load 518 during operation.

In system 500, a first terminal of coil 502 is coupled to a first terminal of coil 504. A second terminal of coil 502 is coupled to a first terminal of capacitor 506 and a drain terminal of FET 510. A second terminal of capacitor 506 is coupled to a gate terminal of FET 512. A source terminal of FET 510 is coupled to ground 514, and a source terminal of FET 512 is coupled to ground 514. A second terminal of coil 504 is coupled to a first terminal of capacitor 508 and a drain terminal of FET 512. A second terminal of capacitor 508 is coupled to a gate terminal of FET 510. Coils 502 and 504 are substantially identical in one example.

System 500 further includes DC gate biasing circuitry 520. DC gate biasing circuitry 520 sets the gate-to-source voltages $V_{gs}$ of FETs 510 and 512 to produce programmed voltages and currents for the operation of each FET 510 and 512. Any appropriate circuitry is used to provide DC gate biasing. DC gate biasing circuitry 520 is used to set appropriate operating points for FETs 510 and 512. In one example, components 522 and 524 are used with DC gate biasing circuitry 520 to properly bias FETs 510 and 512. Components 522 and 524 may be either resistors or inductors in some examples. A receiver or transmitter that uses DC gate biasing can replace any of the receivers or transmitters shown in the examples described above with respect to FIGS. 1-4.

Figure 6:
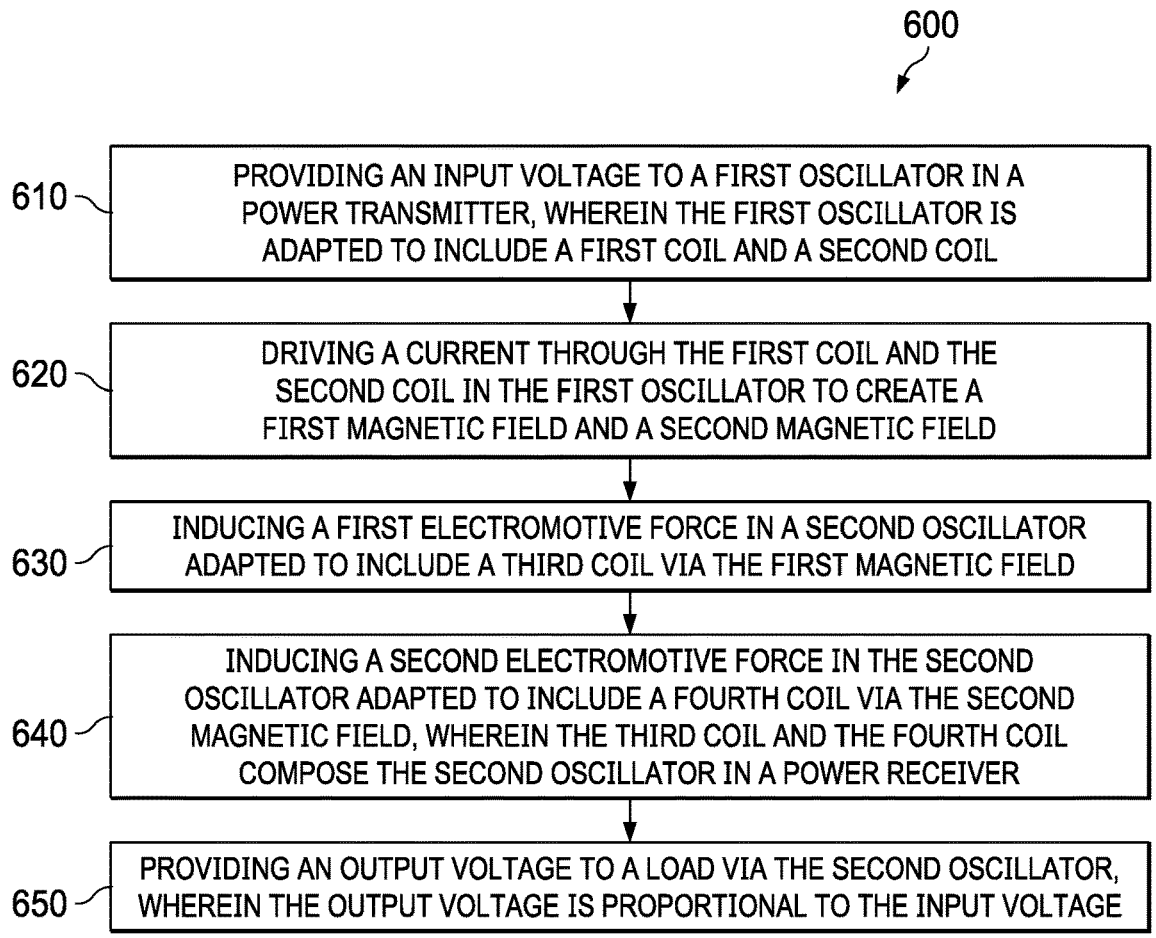
FIG. 6 is a flowchart of an example method for isolated power transfer in accordance with various examples.

FIG. 6 is a flowchart of an example method 600 for isolated power transfer. Although the method steps are described in conjunction with FIGS. 1-5, any system configured to perform the method steps, in any suitable order, is within the scope of this description.

Method 600 begins at step 610, where a voltage source provides an input voltage to a first oscillator in a power transmitter. For example, voltage source $V_{in}$ 104 provides an input voltage to an oscillator in the transmitter in system 200 described above. The first oscillator is adapted to include a first coil and a second coil, such as coils 202 and 204 in an example.

Method 600 continues at step 620, where the first oscillator drives current through the first coil and the second coil in the first oscillator to create a first magnetic field and a second magnetic field. As described above with respect to FIGS. 1A and 1B, the oscillator functions to oscillate charge between an inductor and a capacitor to provide a repeating waveform that is then used to transfer power to a receiver via inductive coupling or capacitive coupling.

Method 600 continues at step 630, where the first magnetic field induces a first electromotive force in a second oscillator, and the second oscillator is adapted to include a third coil. For example, as described above with respect to FIG. 2, the first coil 204 in the transmitter is inductively coupled to the third coil 112 in the receiver, with a coefficient of coupling of $k_A$. The coupled coils can be manufactured to be identical or nearly identical and can reside physically near one another on a chip to increase the values of the coupling coefficients and increase the overall power efficiency of the system.

Referring again to FIG. 6, method 600 continues at step 640, where the second magnetic field induces a second electromotive force in the second oscillator, and the second oscillator is adapted to include a fourth coil. The third coil and the fourth coil are components of a second oscillator in a power receiver. As with the coils described in step 630, the second coil 202 in the transmitter is inductively coupled to the fourth coil 114 in the receiver, with a coefficient of coupling of $k_B$. The coupled coils can be manufactured to be identical or nearly identical and can reside physically near one another on a chip to increase the values of the coupling coefficients and increase the overall power efficiency of the system.

Method 600 continues at step 650, where the power receiver provides an output voltage to a load via the second oscillator, where the output voltage is proportional to the input voltage. In one example, the output voltage is approximately equal to the input voltage. In another example, the output voltage can be scaled higher or lower than the input voltage by adjusting the number of turns in the coils in the oscillators.

While examples herein use two oscillators, in other examples a third oscillator could be injection locked to the first oscillator in the transmitter side and the second oscillator in the receiver side. Any number of oscillators could be frequency locked together in a process called entrainment.

In this description, the term "couple" may cover connections, communications, or signal paths that enable a functional relationship consistent with this description. For example, if device A generates a signal to control device B to perform an action, then: (a) in a first example, device A is coupled to device B; or (b) in a second example, device A is coupled to device B through intervening component C if intervening component C does not substantially alter the functional relationship between device A and device B, such that device B is controlled by device A via the control signal generated by device A. Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, in this description, a circuit or device that includes certain components may instead be adapted to be coupled to those components to form the described circuitry or device. For example, a structure described as including one or more semiconductor elements (such as transistors), one or more passive elements (such as resistors, capacitors and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

While certain components may be described herein as being of a particular process technology, these components may be exchanged for components of other process technologies. Circuits described herein are reconfigurable to include the replaced components to provide functionality at least partially similar to functionality available before the component replacement. Components illustrated as resistors, unless otherwise stated, are generally representative of any one or more elements coupled in series and/or parallel to provide an amount of impedance represented by the illustrated resistor. For example, a resistor or capacitor illustrated and described herein as a single component may instead be multiple resistors or capacitors, respectively, coupled in series or in parallel between the same two nodes as the single resistor or capacitor. Also, uses of the phrase "ground voltage potential" in this description include a chassis ground, an Earth ground, a floating ground, a virtual ground, a digital ground, a common ground, and/or any other form of ground connection applicable to, or suitable for, the teachings of this description. Unless otherwise stated, "about", "approximately", "nearly", or "substantially" preceding a value means +/−10 percent of the stated value.

Modifications are possible in the described examples, and other examples are possible, within the scope of the claims.

What is claimed is:

1. A system, comprising:
a receiver having an output, the receiver including:
a first coil coupled to the output;
a second coil coupled to the output;
a first transistor having a first control terminal, a first current terminal, and a second current terminal, the first current terminal coupled to the output through the first coil, and the first transistor configured to receive a first oscillating signal having a first frequency at the first current terminal;
a second transistor having a second control terminal, a third current terminal, and a fourth current terminal, the third current terminal coupled to the output through the second coil, and the second transistor configured to receive a second oscillating signal having the first frequency at the third current terminal;
a first capacitor coupled between the first current terminal and the second control terminal; and
a second capacitor coupled between the third current terminal and the first control terminal, the receiver configured to:
responsive to the first and second oscillating signals, generate third and fourth oscillating signals having a second frequency based on the first frequency; and
responsive to the third and fourth oscillating signals, provide a voltage at the output.

2. The system of claim 1, wherein the first and second coils and the first and second transistors are configured to be a class E oscillator.

3. The system of claim 1, wherein the first and second coils and the first and second transistors are configured to be a class F oscillator.

4. The system of claim 1, wherein the first and second capacitors and the first and second coils are configured to resonate at the second frequency and to lock the second frequency to the first frequency via injection locking.

5. The system of claim 1, wherein:
the first coil is magnetically or capacitively coupled to a third coil to receive the first oscillating signal, the first coil having a first number of turns and the third coil having a second number of turns;
the second coil is magnetically or capacitively coupled to a fourth coil to receive the second oscillating signal, the second coil having the first number of turns and the fourth coil having the second number of turns; and the first number of turns substantially equals the second number of turns.

6. The system of claim 1, wherein:

the first coil is inductively coupled to a third coil to receive the first oscillating signal;

the second coil is inductively coupled to a fourth coil to receive the second oscillating signal; and a first coefficient of coupling between the first coil and the third coil is substantially equal to a second coefficient of coupling between the second coil and the fourth coil.

7. The system of claim 1, wherein:

the first transistor is configured to switch state responsive to the second oscillating signal and when a voltage between the first and second current terminals is zero; and the second transistor is configured to switch state responsive to the first oscillating signal and when a voltage between the third and fourth current terminals is zero.

8. The system of claim 1, wherein the first oscillating signal and the second oscillating signal are generated from a DC voltage; and wherein the receiver is isolated from the DC voltage.

9. The system of claim 1, wherein the first and second oscillating signals are received from an oscillator.

10. The system of claim 1, wherein the first coil is capacitively coupled to a third coil to receive the first oscillating signal; and wherein the second coil is inductively coupled to a fourth coil to receive the second oscillating signal.

11. The system of claim 1, wherein the first coil and the first capacitor are configured to generate the third oscillating signal when the first transistor is disabled responsive to the second oscillating signal; and wherein the second coil and the second capacitor are configured to generate the fourth oscillating signal when the second transistor is disabled responsive to the first oscillating signal.

12. The system of claim 1, further comprising first and second filters;

wherein the first current terminal is coupled to the first filter to shape the first oscillating signal; and wherein the second current terminal is coupled to the second filter to shape the second oscillating signal.

13. A system, comprising:

a transmitter having an input, the transmitter including a first coil and a second coil and configured to:

receive a first voltage at the input, the first voltage being a direct current (DC) voltage;

generate a first oscillating signal at the first coil, the first oscillating signal having a first frequency; and generate a second oscillating signal at the second coil, the second oscillating signal having the first frequency; and a receiver having an output and including a third coil and a fourth coil coupled to the output, the third coil and the fourth coil inductively or capacitively coupled to the respective first coil and second coil, the receiver configured to:

receive the first oscillating signal at the third coil;

receive the second oscillating signal at the fourth coil;

generate a third oscillating signal at the third coil, the third oscillating signal having a second frequency based on the first frequency;

generate a fourth oscillating signal at the fourth coil, the fourth oscillating signal having the second frequency; and provide a second voltage at the output responsive to the third and fourth oscillating signals.

14. The system of claim 13, wherein the transmitter is configured to cause the receiver to resonate at the second frequency and to lock the second frequency to the first frequency via injection locking.

15. The system of claim 14, wherein the transmitter and the receiver include respective class E oscillators.

16. The system of claim 14, wherein the transmitter and the receiver include respective class F oscillators.

17. The system of claim 13, further comprising first and second capacitors, wherein the first coil is coupled to the third coil through the first capacitor; and wherein the second coil is coupled to the fourth coil through the second capacitor.

18. The system of claim 17, wherein the first capacitor is configured to transmit the first oscillating signal from the first coil to the third coil; and wherein the second capacitor is configured to transmit the second oscillating signal from the second coil to the fourth coil.

19. A method, comprising:

responsive to a first voltage, generating first and second oscillating signals by a transmitter, the first voltage being a DC voltage and the first and second oscillating signals having a first frequency;

responsive to the first oscillating signal, generating a third oscillating signal at a first transistor of a receiver, the third oscillating signal having a second frequency based on the first frequency;

responsive to the second oscillating signal, generating a fourth oscillating signal at a second transistor of the receiver, the fourth oscillating signal having the second frequency; and responsive to the third and fourth oscillating signals, generating a second voltage.

20. The method of claim 19, wherein the first oscillating signal is generated at a first coil of the transmitter, the first coil is coupled between a third transistor of the transmitter and an input of the transmitter, and the first voltage is received at the input; and wherein the second oscillating signal is generated at a second coil of the transmitter, and the second coil is coupled between the input and a fourth transistor of the transmitter; and wherein the third and fourth transistors are cross coupled.

21. The method of claim 20, wherein the first coil is coupled to a first current terminal of the third transistor, and a first control terminal of the third transistor is coupled to the second coil through a first capacitor;

wherein the second coil is coupled to a second current terminal of the fourth transistor, and a second control terminal of the fourth transistor is coupled to the first coil through a second capacitor;

wherein the first coil and the first capacitor provide a first resonant gate drive for the fourth transistor; and wherein the second coil and the second capacitor provide a second resonant gate drive for the third transistor.

22. The method of claim 20, wherein the first oscillating signal is received at a third coil of the receiver via a first coupling between the first coil and the third coil, the third coil is coupled between an output of the receiver and the first transistor of the receiver, and the second voltage is provided at the output;
    wherein the second oscillating signal is received at a fourth coil of the receiver via a second coupling between the second coil and the fourth coil, and the fourth coil is coupled between the output and the second transistor of the receiver;
    wherein the first and second transistors are cross coupled; and
    wherein the first coupling and the second coupling comprises an inductive coupling or a capacitive coupling.

23. The method of claim 22, wherein the third coil is coupled to a third current terminal of the first transistor, and a third control terminal of the first transistor is coupled to the fourth coil via a third capacitor:
    wherein the fourth coil is coupled to a fourth current terminal of the second transistor, and a fourth control terminal of the second transistor is coupled to the third coil via a fourth capacitor;
    wherein the third coil and the third capacitor provide a third resonant gate drive for the second transistor; and
    wherein the fourth coil and the fourth capacitor provide a fourth resonant gate drive for the first transistor.

24. The method of claim 19, wherein the third and fourth oscillating signals are generated by resonating at the second frequency and locking the second frequency to the first frequency via injection locking.

25. A system, comprising:
    a receiver having an output and including:
    a first transistor having a first control terminal, a first current terminal, and a second current terminal, and the first transistor configured to receive a first oscillating signal having a first frequency at the first current terminal; and
    a second transistor having a second control terminal, a third current terminal, and a fourth current terminal, and the second transistor configured to receive a second oscillating signal having the first frequency at the third current terminal,
    the first control terminal coupled to the third current terminal; and
    the second control terminal coupled to the first current terminal, and the receiver configured to:
    responsive to the first and second oscillating signals, generate third and fourth oscillating signals having a second frequency based on the first frequency; and
    responsive to the third and fourth oscillating signals, provide a voltage at the output.

26. The system of claim 25, further comprising first and second capacitors, wherein the first capacitor is coupled between the first current terminal and the second control terminal, and the second capacitor is coupled between the second current terminal and the first control terminal.

27. The system of claim 25, further comprising first and second coil, wherein the first coil is coupled between the output and the first current terminal, and the second coil is coupled between the output and the second current terminal.

\* \* \* \* \*